(12) United States Patent
Sato et al.

(10) Patent No.: US 7,091,546 B2
(45) Date of Patent: Aug. 15, 2006

(54) SEMICONDUCTOR MEMORY WITH TRENCH CAPACITOR AND METHOD OF FABRICATING THE SAME

(75) Inventors: Mitsuru Sato, Yokkaichi (JP); Hirofumi Inoue, Yokkaichi (JP); Masaru Kito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/038,173

(22) Filed: Jan. 21, 2005

(65) Prior Publication Data
US 2005/0184323 A1    Aug. 25, 2005

(30) Foreign Application Priority Data
Jan. 21, 2004    (JP)    ............................ 2004-012883

(51) Int. Cl.
*H01L 29/772* (2006.01)
(52) U.S. Cl. .................. 257/301; 257/68; 257/296; 257/303; 257/306; 257/532
(58) Field of Classification Search .................. 257/68, 257/71, 296, 301, 303, 306, 532, E27.084, 257/E21.646
See application file for complete search history.

(56) References Cited
U.S. PATENT DOCUMENTS
6,310,359 B1    10/2001    Chaloux et al.
6,528,383 B1 *  3/2003    Chakravarti et al. ........ 438/381
2002/0158281 A1* 10/2002   Goldbach et al. ........... 257/296
2003/0030091 A1*  2/2003   Bulsara et al. .............. 257/301

FOREIGN PATENT DOCUMENTS
JP    7-202026    8/1995
JP    2000-31412    1/2000

* cited by examiner

Primary Examiner—George R. Fourson
Assistant Examiner—Joannie Adelle Garcia
(74) Attorney, Agent, or Firm—Oblon, Spivak, McClelland, Maier & Neustadt, P.C.

(57) ABSTRACT

A semiconductor device includes semiconductor substrate, a trench capacitor formed in the semiconductor substrate, a cell transistor formed so as to the trench capacitor and having a gate electrode formed on the semiconductor substrate and a source/drain region formed in a surface of the semiconductor substrate, an impurity diffusion region formed in the semiconductor substrate so as to be electrically connected between the trench capacitor and the source/drain region, and a Ge inclusion region formed between the impurity diffusion region and the trench capacitor.

3 Claims, 14 Drawing Sheets

SEMICONDUCTOR MEMORY WITH TRENCH CAPACITOR AND METHOD OF FABRICATING THE SAME

CROSS-REFERENCE TO RELATED APPLICATION

This application claims priority to Japanese patent application No. 2004-12883, the content of which is incorporated herein by reference.

BACKGROUND OF THE INVENTION

1. Field of the Invention

The present invention relates to a semiconductor memory with a trench capacitor, such as DRAM array, and a method of fabricating the same.

2. Description of the Related Art

Performance of dynamic random access memory (DRAM) arrays has been improved with reduction in their size. However, short-channel effects of transistors have become intense with reduction in the size of the DRAM arrays, whereupon the performance of DRAM arrays has been reduced. In view of this problem, an acceptor impurity such as boron (B) has been implanted into a channel region of a cell transistor to adjust a cutoff characteristic of the cell transistor. The foregoing problem has been overcome by adjusting an amount of the impurity.

However, when the density of impurity implanted to the channel region of the cell transistor is increased in order that the short-channel effects may be suppressed, the impurity density in a source/drain region of the cell transistor is also increased, whereupon a data-hold time of the memory cell is rendered shorter as the result of the increase in the impurity density in the source/drain region. Accordingly, JP-A-2000-31412 discloses a method of suppressing reduction in the data-hold time of the memory cell while the threshold voltage is suppressed from drop due to the short-channel effects.

In JP-A-2000-31412, impurity is implanted into the channel region in a direction oblique to the cell transistor so that the impurity density is increased in the channel region of the cell transistor and further so that no impurity is implanted into the source/drain region which becomes the shadow of the cell transistor, whereby the impurity density is suppressed from being increased in the source/drain region.

In DRAM with the trench capacitor structure, however, leak current (junction leak current) is increased in a junction of the capacitor side diffusion layer of the cell capacitor when the density of impurity diffused to the channel region of the cell transistor. As a result, a discharging speed of the trench capacitor is increased. Further, when the trench capacitor is brought into electrical contact with the transistor at a location lower than the upper side of the silicon semiconductor substrate, occurrence of punch-through at a deeper location is a matter of concern. The above-mentioned document discloses nothing about these respects.

BRIEF SUMMARY OF THE INVENTION

Therefore, an object of the present invention is to provide a semiconductor device which can suppress an off-current of the cell transistor even when the size thereof results in conspicuous short-channel effects and which can further suppress leak current in the junction of the capacitor side diffusion layer of the cell capacitor, and a method of fabricating the semiconductor device.

The present invention provides a semiconductor device comprising a semiconductor substrate, a trench capacitor formed in the semiconductor substrate, a cell transistor formed so as to conduct to the trench capacitor and having a gate electrode formed on the semiconductor substrate and a source/drain region formed in a surface of the semiconductor substrate, an impurity diffusion region formed in the semiconductor substrate so as to be electrically connected between the trench capacitor and the source/drain region, and a Ge inclusion region formed between the impurity diffusion region and the trench capacitor.

The invention also provides a method of fabricating a semiconductor device comprising forming a trench in a silicon semiconductor substrate, the trench having an inner wall, burying a conductive layer in the trench, implanting Ge to an upper portion of the inner wall of the trench in which the conductive layer is buried, and forming an impurity diffusion region in an outside of a Ge implanted portion.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

Figure 1:
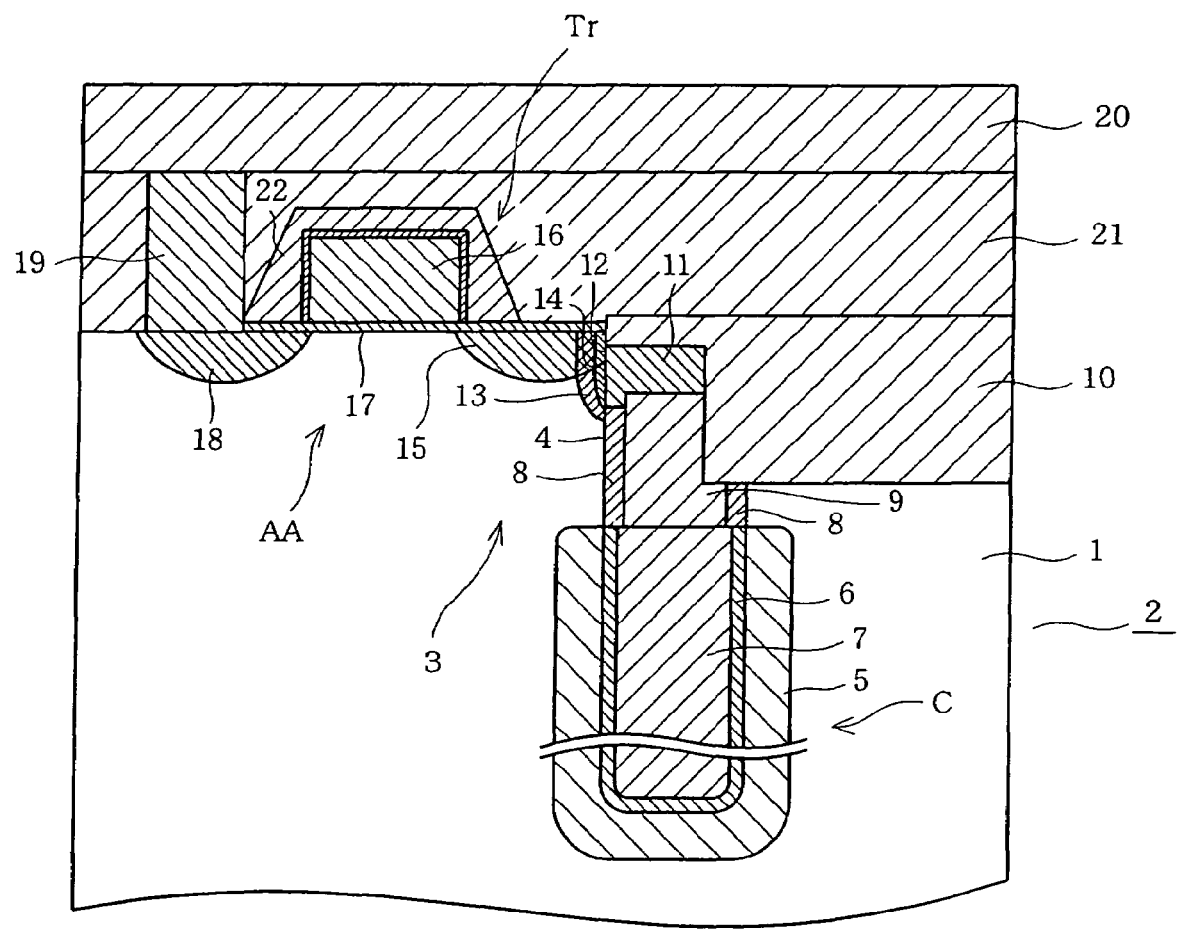
FIG. 1 is a longitudinal side section of the semiconductor device in accordance with a first embodiment of the present invention.
Figure 2:
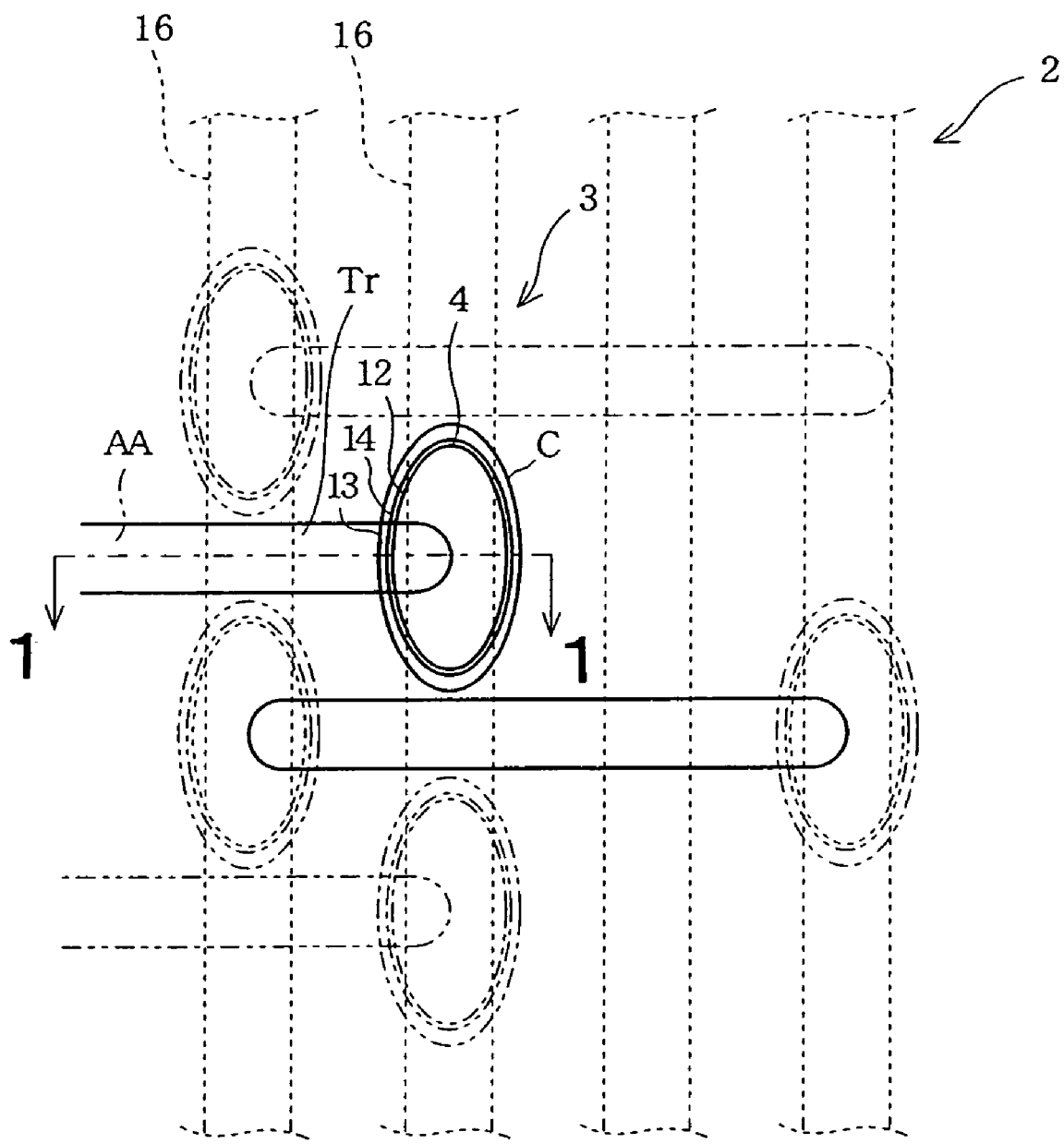
FIG. 2 is a schematic transverse section of the semiconductor device.

A first embodiment of the present invention will be described with reference to FIGS. 1 to 12. In the drawings, a scale factor with respect to the longitudinal direction differs from a scale factor with respect to the transverse direction in order that the characterized part of the present invention may be shown in a clearer and more understandable mode. FIGS. 1 and 2 are a longitudinal side section and a transverse section of a trench capacitor DRAM array serving as a semiconductor device respectively. Although a p-type silicon semiconductor substrate 1 is used in the first embodiment, a reverse conducting silicon semiconductor substrate may be used, instead, as occasion demands.

Referring to FIG. 2, the arrangement of memory cells of the DRAM allays is schematically shown. As shown, the trench capacitor DRAM array includes a silicon semiconductor substrate 1 and a memory cell region in which a plurality of memory cells 3 are provided on the substrate 1. Reference symbol "AA" in FIG. 2 designates an active area of the memory cell 3. FIG. 1 is a longitudinal side section taken along line 1—1 in FIG. 2. Each memory cell 3 comprises one trench capacitor C and one cell transistor Tr as shown in FIG. 1.

An arrangement of one unit memory cell 3 will be described. The memory cell 3 is formed with a deep trench 4 in which the trench capacitor C is formed. A plate diffusion layer 5 is formed along an outer periphery of the trench 4. The plate diffusion layer 5 extends upward from the lower end of the trench 4 so as to have a predetermined height. The plate diffusion layer 5 serves as a plate electrode of the trench capacitor C constituting the memory cell 3. A capacitor insulating film 6 is formed on the inner surface of the trench 4 so as to be located on the plate diffusion layer 5. The capacitor insulating film 6 comprises an $SiN$—$SiO_2$ film or $Al_2O_3$—$SiO_2$ or $HfO_2$—$SiO_2$ and serves as an insulating film for isolating both electrodes of the trench capacitor C. A first conductive layer 7 is formed on the inner surface of the trench 4 so as to be located on the inner surface of the capacitor insulating film 6. The first conductive layer 7 is made from a polycrystalline silicon or polycide and serves as a plate electrode of the trench capacitor C.

An insulating film 8 is formed on the inner peripheral wall of the trench 4 so as to be located over the capacitor insulating film 6. The insulating film 8 suppresses leak current from a vertical parasitic transistor. A second conductive layer 9 is formed inside the insulating film 8. The second conductive layer 9 is made from a polycrystalline silicon or polycide. An oxide film serving as an element isolation film 10 is formed so as to be adjacent to the second conductive layer 9, so that the memory cell 3 is functionally isolated from other memory cells (not shown).

A third conductive layer 11 is formed on the second conductive layer 9. The third conductive layer 11 is made from a polycrystalline doped with a donor impurity such as arsenic (As) or phosphorus (P) or polycide. The third conductive layer 11 serves as a buried strap.

The cell transistor Tr is formed at a predetermined side of the trench 4 so as to be adjacent to the trench capacitor C. An isotropic strap 13 corresponding to an impurity diffusion layer in the invention is formed on the outer periphery including a boundary between the third conductive layer buried in the trench 4 and the cell transistor Tr as shown in FIG. 2. The donor impurity is outwardly diffused from the third conductive layer 11 through the boundary 12, whereby the strap 13 is formed on the upper outer periphery of the trench 4. Germanium (Ge) is implanted so as to be interposed between the strap 13 and the third conductive layer 11 thereby to be formed into an inclusion region 14 in which Ge has been implanted. The inclusion region 14 is formed on an opposite surface at the diffusion layer 15 side. The inclusion region 14 is capable of suppressing outward diffusion of Ge from the third conductive layer 11 to the silicon semiconductor substrate 1.

The cell transistor Tr includes a gate electrode 16, gate insulating film 17 and n-type diffusion layers 15 and 18 (a drain diffusion layer and a source diffusion layer). A bit line 20 is connected via a contact plug 19 to the diffusion layer 18. An interlayer insulating film 21 is provided to electrically isolate the bit line 20 from the cell transistor Tr and trench capacitor C. A gate sidewall insulating film 22 is formed so as to cover the gate electrode 16. The trench capacitor C includes the first to third conductive layers 7, 9 and 11 in the trench 4, the plate diffusion layer 5 and the insulating film 6. Thus, the memory cell 3 constituted as described above is arranged as shown in FIG. 2. The trench 4 is formed so as to have an elliptic transverse section.

The short-channel effects are conventionally remarkable with reduction in designed size of the device. When the short-channel effects become intense, an amount of charge (off current) discharged from the trench capacitor C is increased even during turn-off of the cell transistor Tr, whereupon an information dissipating speed becomes higher than conventional arrangement. In consideration of the problem, the inclusion region 14 in which Ge has been implanted is provided in the embodiment. The implantation of Ge into the boundary 12 can suppress the short-channel effects resulting from unnecessary outward diffusion of Ge from the third conductive layer 11 to the cell transistor Tr side. Thus, in the embodiment, both inclusion region 14 and strap 13 are provided at the side of the diffusion layer 15 of the cell transistor Tr, so that such unnecessary diffusion as to result in the short-channel effects of the cell transistor C while the electrical resistance is suppressed in the junction between the third conductive layer 11 buried in the trench 4 and the cell transistor Tr and the electrical resistance between the diffusion layer 15 and the trench capacitor C.

In the foregoing embodiment, the Ge inclusion region 14 is formed at the diffusion layer 15 side so as to be interposed between the diffusion layer 15 of the cell transistor Tr and the third conductive layer 11 of the trench capacitor C. Consequently, even when the third conductive layer 11 is doped with high-density impurity, which is diffused outward to the silicon semiconductor so that the strap 13 is formed, the impurity can be prevented from unnecessary diffusion to the cell transistor Tr side and accordingly, DRAM 2 can be fabricated without reduction in the short-channel effects.

Figure 3:
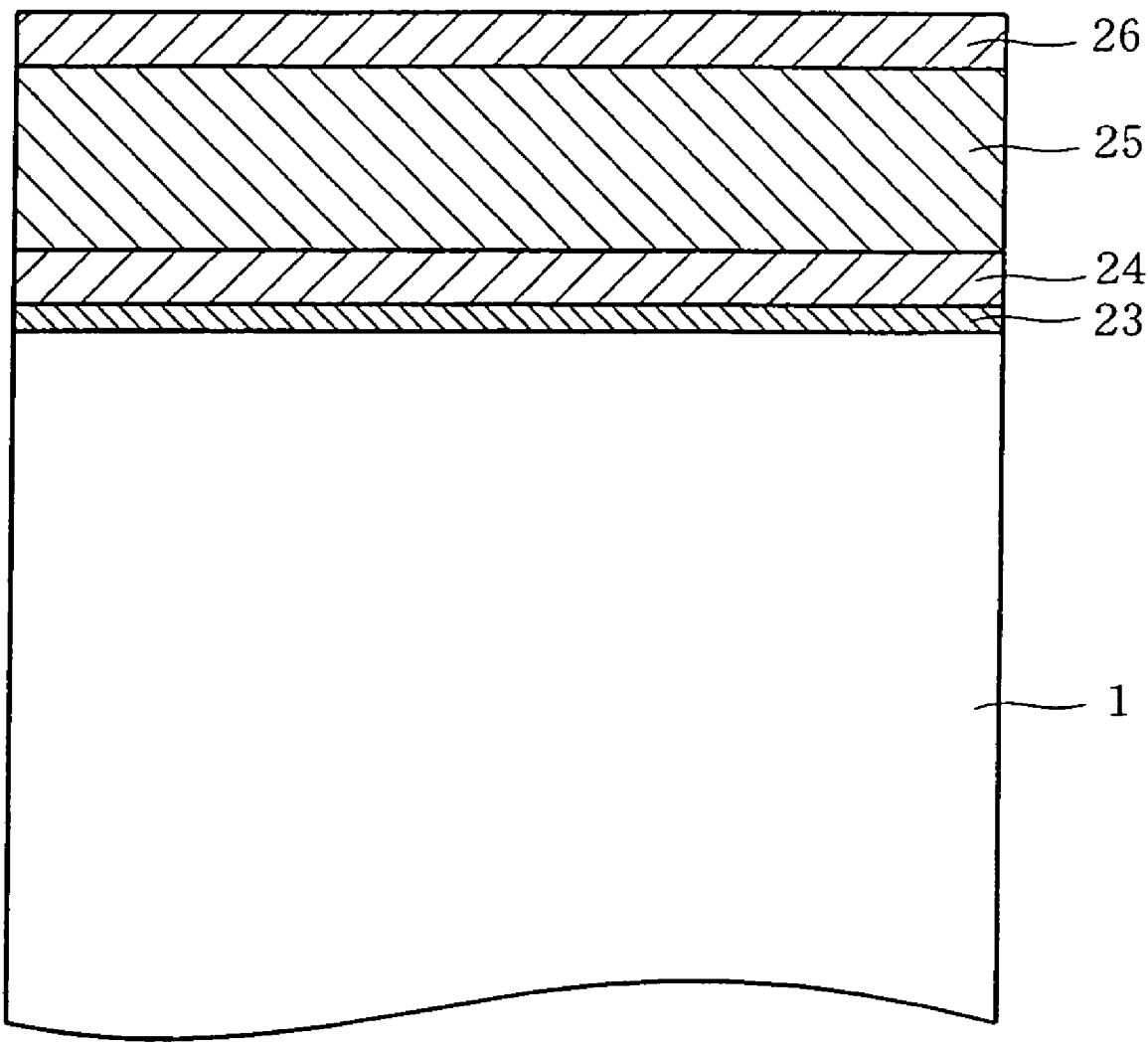
FIG. 3 is a longitudinal side section of the semiconductor device, showing a fabrication step thereof (step 1)

A method of fabricating the foregoing trench capacitor DRAM will now be described with reference to FIGS. 3 to 12. FIGS. 3 to 12 illustrate a sequence of the fabricating method. Firstly, as shown in FIG. 3, a silicon oxide film or silicon nitride film 23 is deposited on the silicon semiconductor substrate 1. A silicon nitride film 24 is deposited on the silicon oxide or nitride film 23. A boron silicate glass (BSG) film 25 is deposited on the silicon nitride film 24. A tetra ethyl orthosilicate film 26 is deposited on the BSG film 25.

Figure 4:
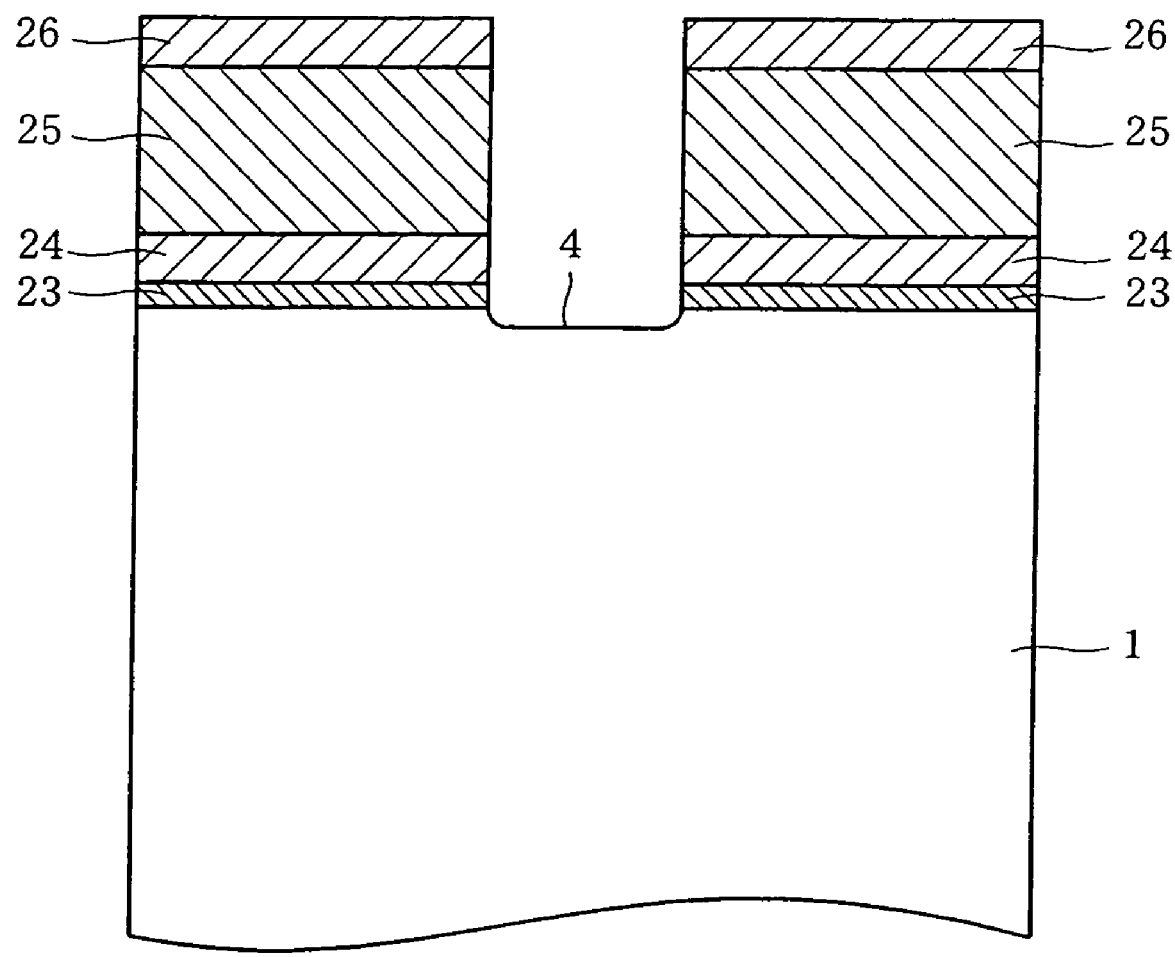
FIG. 4 is a longitudinal side section of the semiconductor device, showing a fabrication step thereof (step 2)
Figure 5:
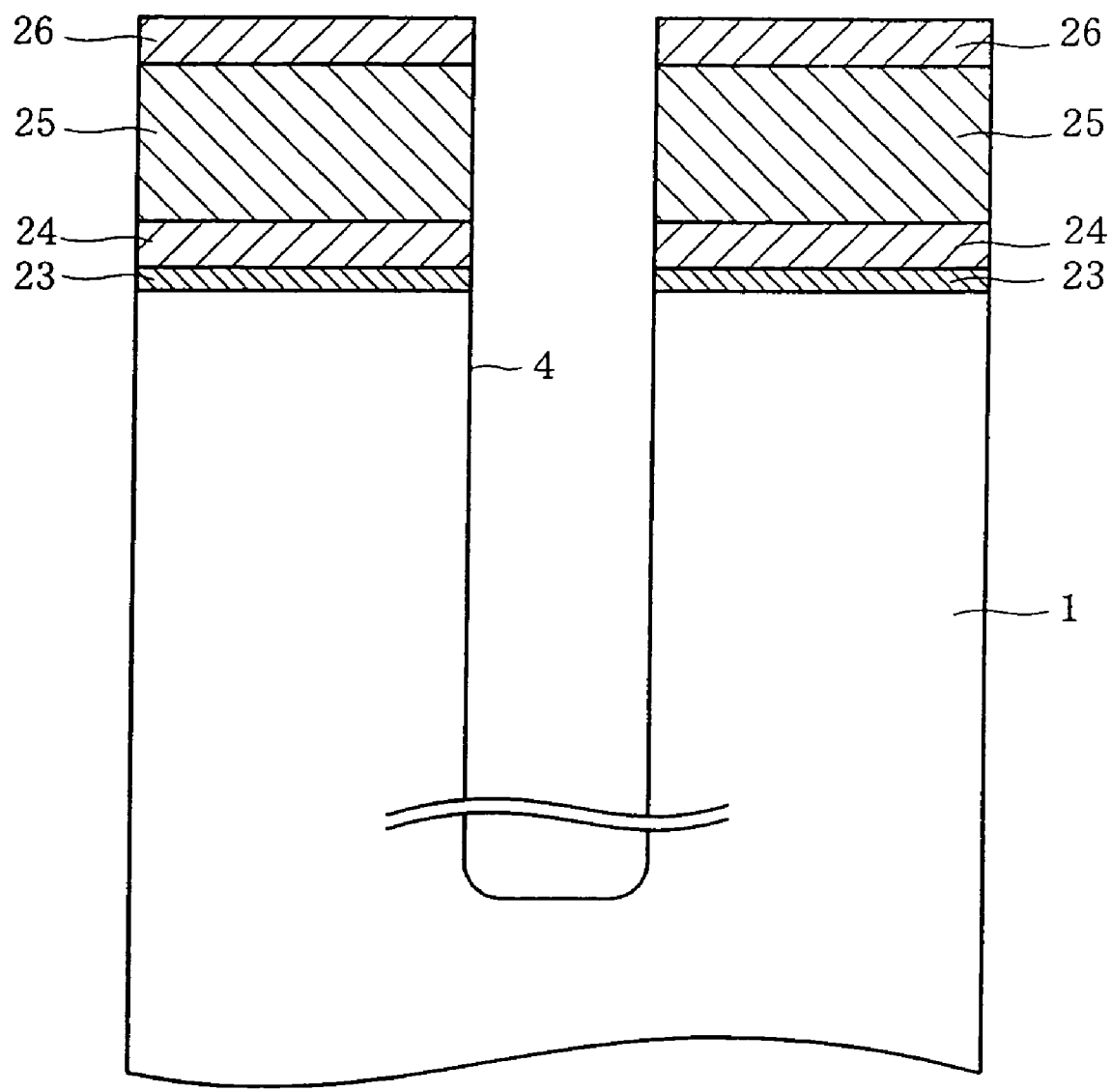
FIG. 5 is a longitudinal side section of the semiconductor device, showing a fabrication step thereof (step 3)

Furthermore, as shown in FIG. 4, a photoresist (not shown) is patterned on the TEOS film 26 in order that a deep trench may be formed. The silicon oxide film 23, silicon nitride film 24, BSG film 25 and TEOS film 26 are etched by the anisotropic etching so that the trench 4 is formed, and thereafter, the resist pattern is removed. Subsequently, as shown in FIG. 5, the silicon semiconductor substrate 1 is etched to a predetermined depth by the anisotropic etching with the BSG and TEOS films 25 and 26 serving as a mask, whereby the trench 4 is formed. The BSG and TEOS films 25 and 26 are then removed.

Figure 6:
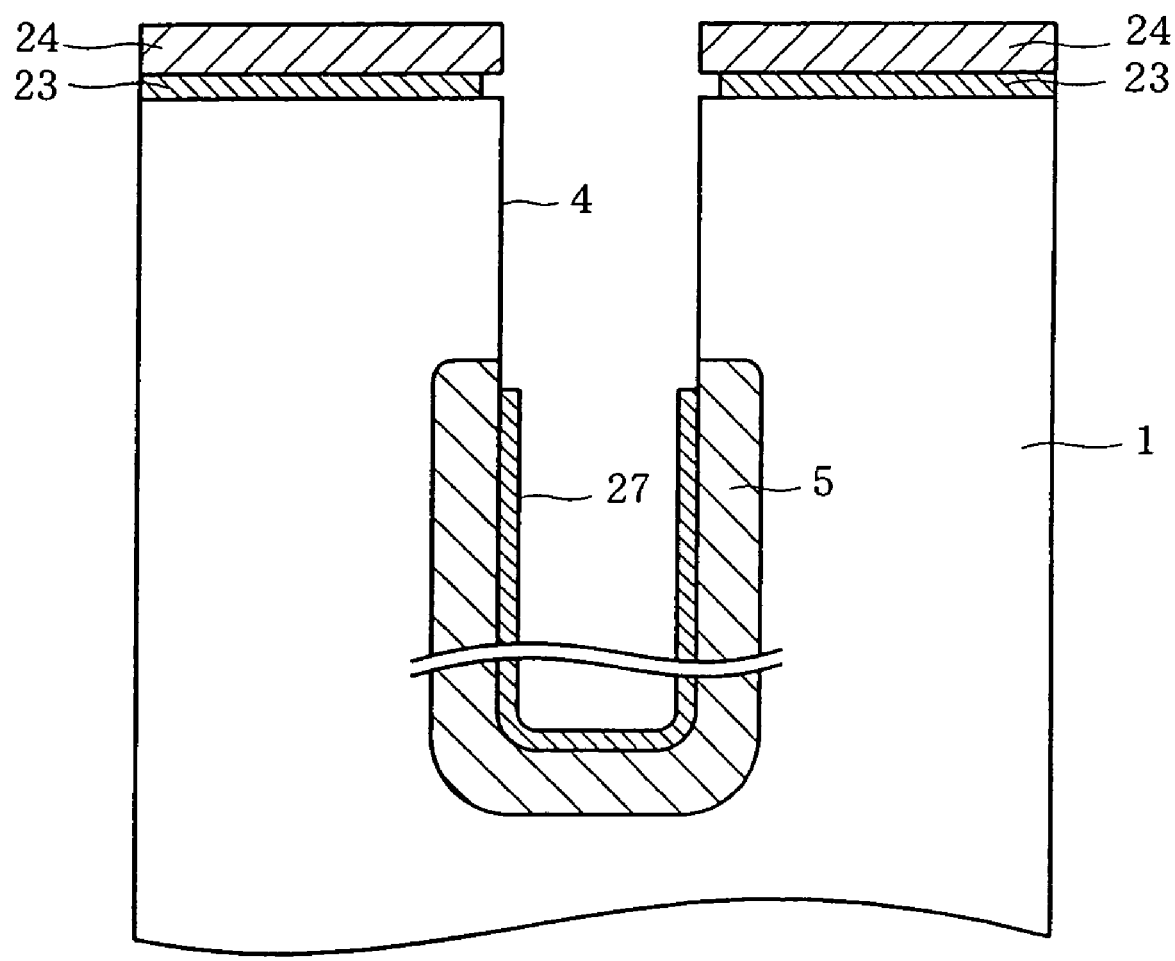
FIG. 6 is a longitudinal side section of the semiconductor device, showing a fabrication step thereof (step 4)
Figure 7:
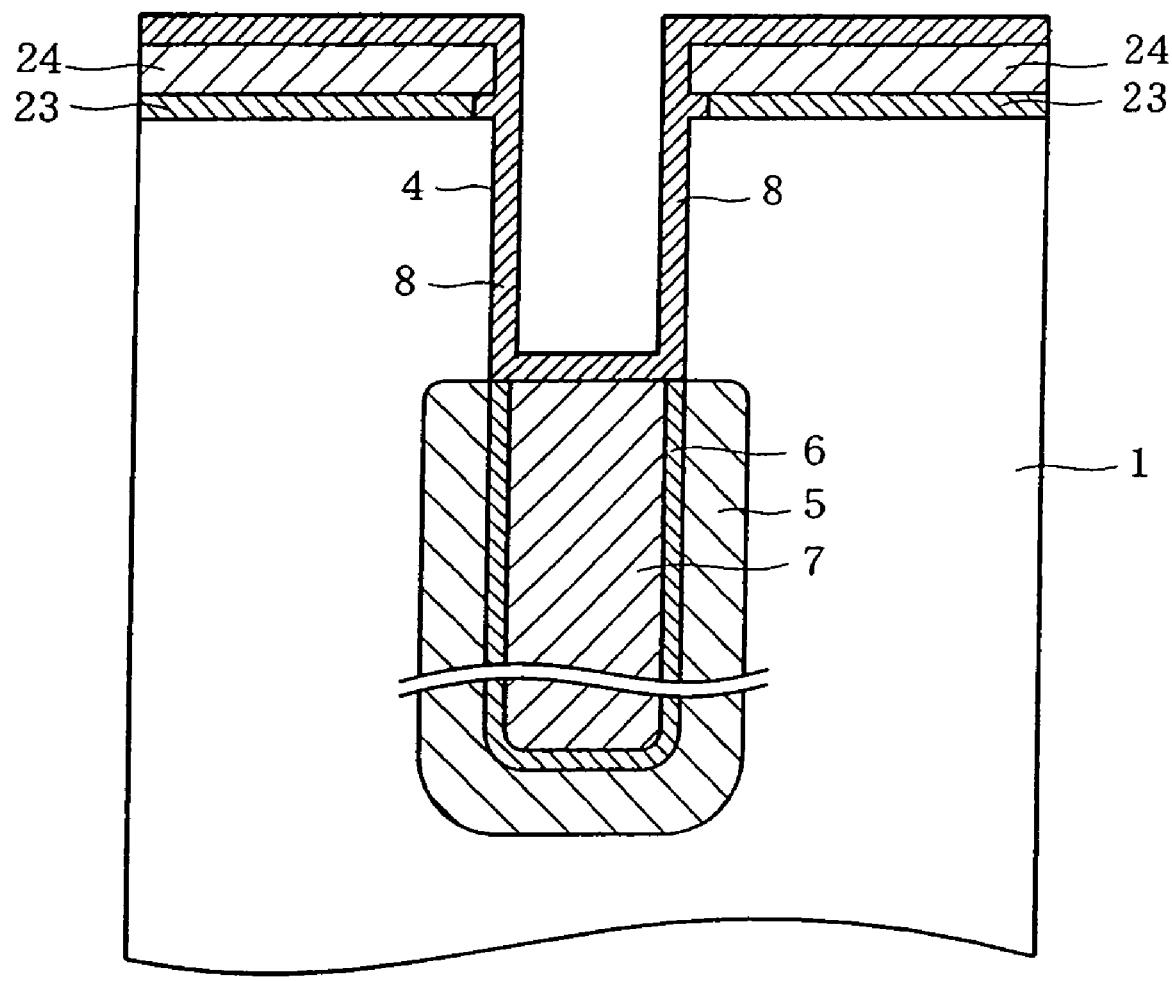
FIG. 7 is a longitudinal side section of the semiconductor device, showing a fabrication step thereof (step 5)

Furthermore, as shown in FIG. 6, silica glass 27 doped with impurity is deposited on an inner surface of the trench 4 so as to reach a predetermined depth from the bottom of the trench. The deposited silica glass 27 is covered with a TEOS film (not shown) and then heat-treated at a high temperature so that the plate diffusion layer 5 of the trench capacitor C is formed on the side of the trench 4. Subsequently, the TEOS film and silica glass 27 in the trench 4 are removed and the interior of the trench 4 is cleaned. Thereafter, as shown in FIG. 7, the part of the silicon semiconductor substrate 1 constituting the inner surface of the trench 4 is nitrided thereby to be formed into a thin silicon nitride film. Further, the surface of the silicon nitride film is oxidized so that the capacitor insulating film 6 is formed. The first conductive layer 7 made from a polycrystalline silicon material doped with arsenic is formed inside the capacitor insulating film 6. The plate diffusion layer 5 and first conductive layer 7 serve as both plate electrodes.

Figure 8:
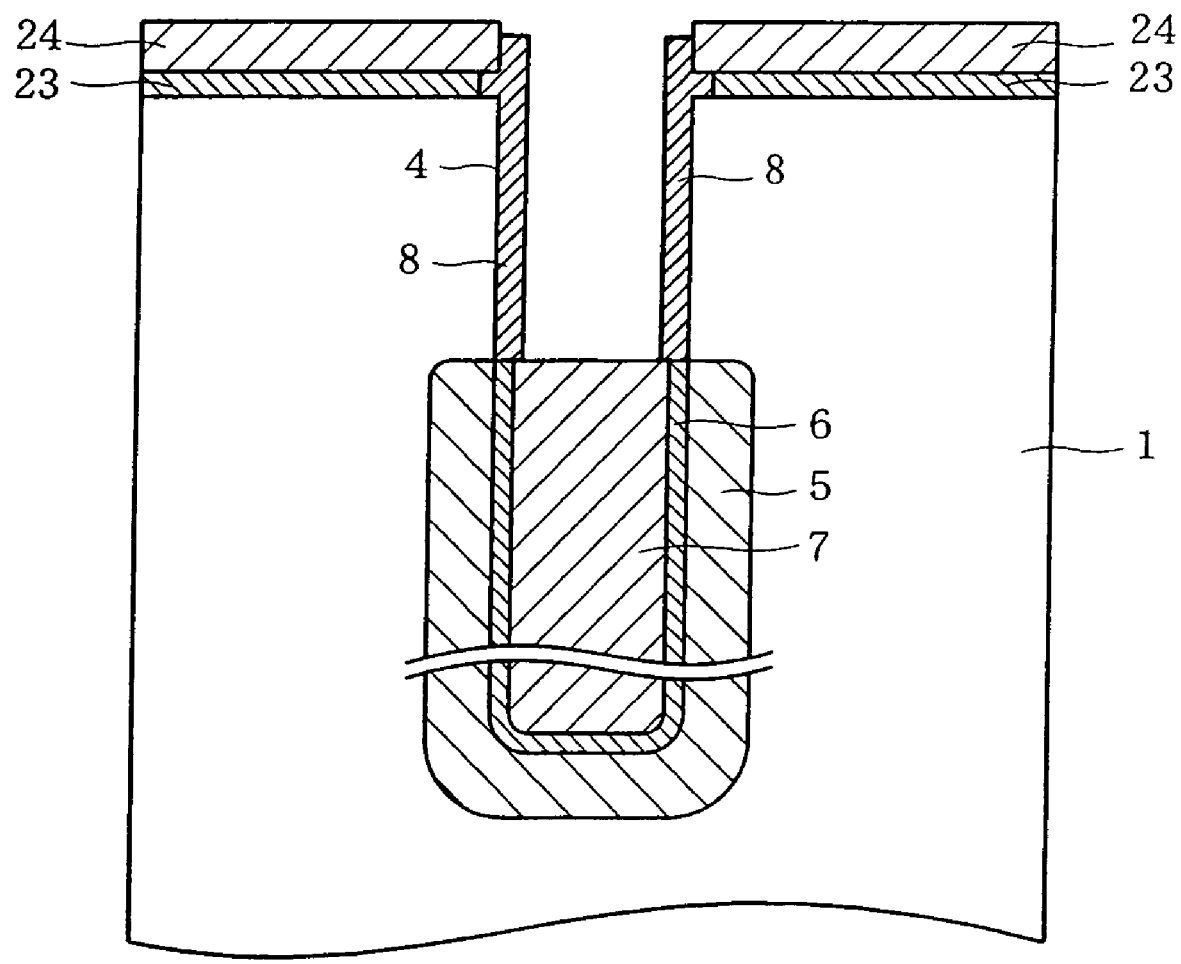
FIG. 8 is a longitudinal side section of the semiconductor device, showing a fabrication step thereof (step 6)

The first conductive layer 7 and capacitor insulating film 6 are etched to their parts located at the top of the plate diffusion layer 5. An insulating film 8 is formed on the etched portions. The insulating film 8 is formed by depositing TEOS. The insulating film 8 formed on the first conductive layer 7 is removed by the anisotropic etching as shown in FIG. 8. Accordingly, the insulating film 8 remaining on the inner wall of the trench 4 serves as the insulating film 8.

Figure 9:
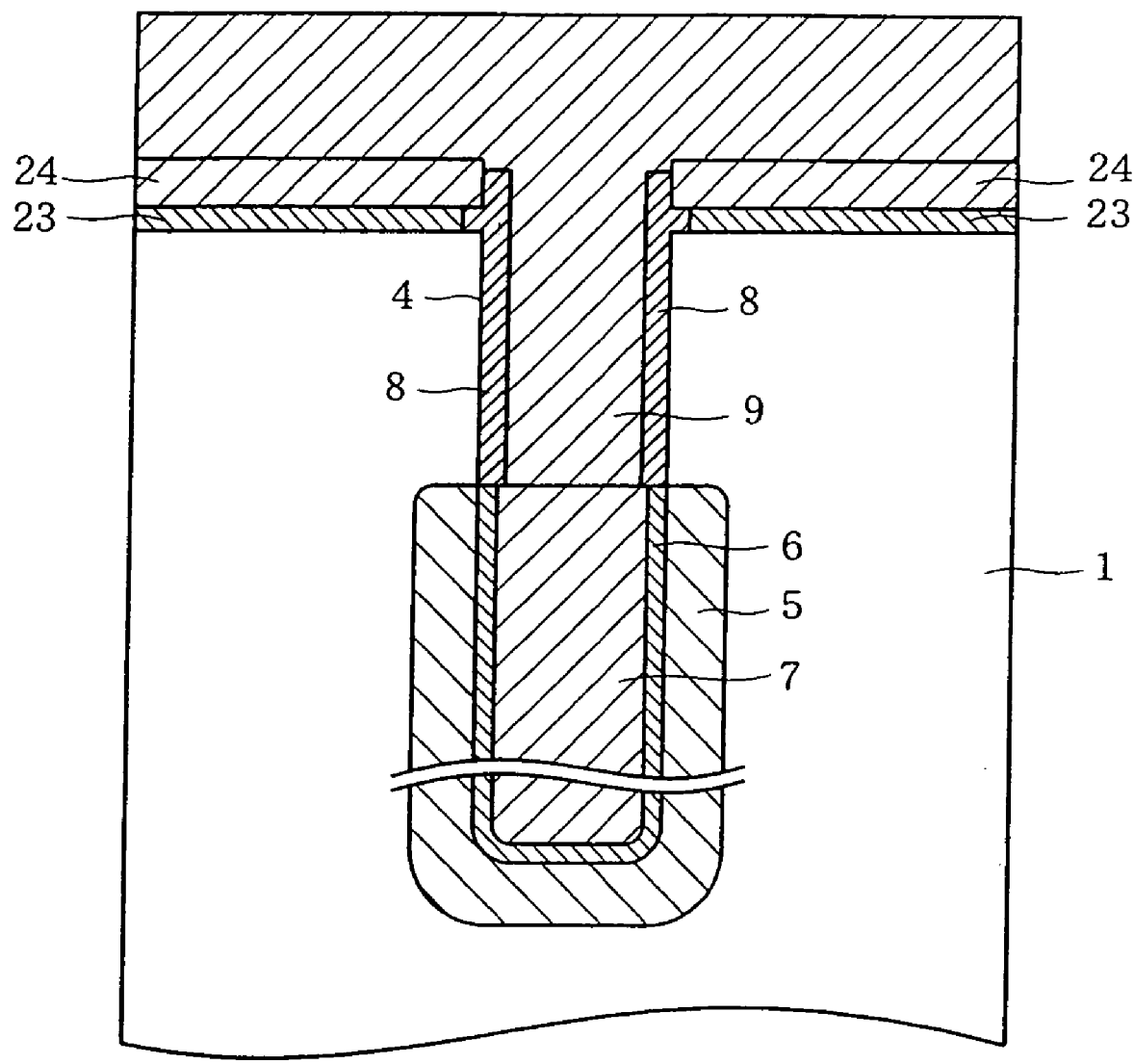
FIG. 9 is a longitudinal side section of the semiconductor device, showing a fabrication step thereof (step 7)
Figure 10:
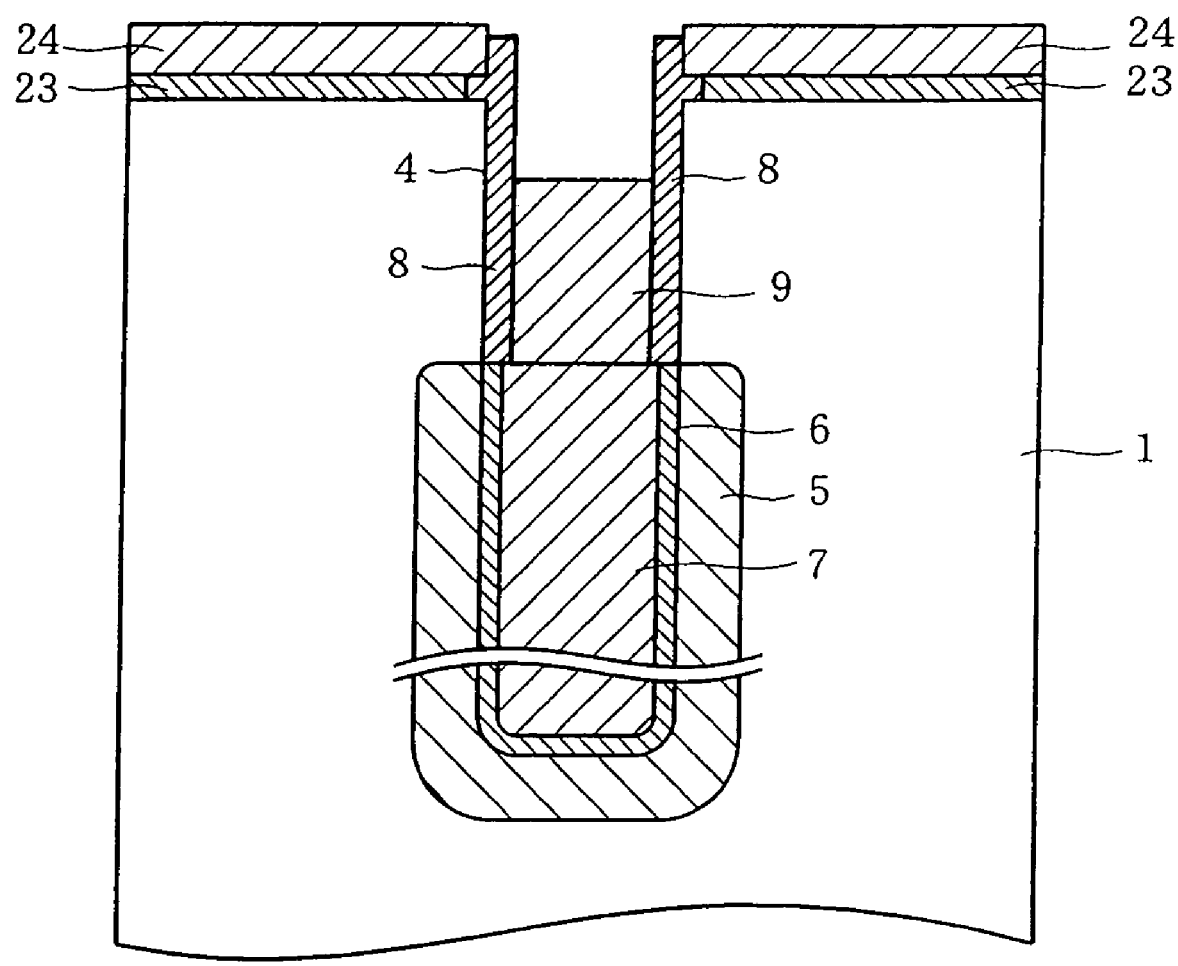
FIG. 10 is a longitudinal side section of the semiconductor device, showing a fabrication step thereof (step 8)
Figure 11:
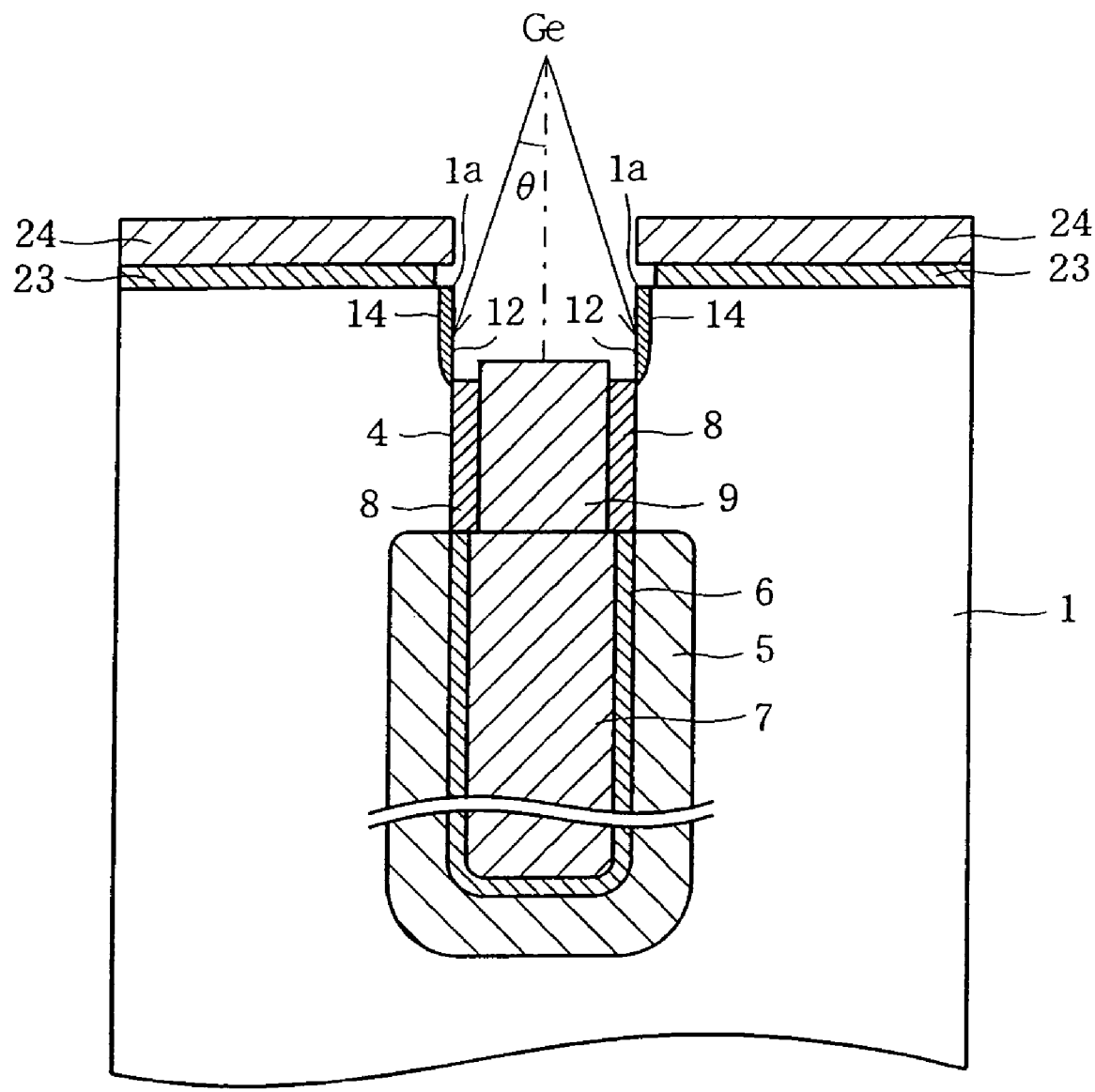
FIG. 11 is a longitudinal side section of the semiconductor device, showing a fabrication step thereof (step 9)

The second conductive layer 9 made from polycrystalline silicon is buried in the trench 4 so as to be stacked on the first conductive layer 7 from which the insulating film 8 has been removed, as shown in FIG. 9. The second conductive film 9 may be made from polycide, instead. Furthermore, as shown in FIG. 10, the second conductive layer 9 is etched to a part thereof located slightly deeper than the upper surface of the silicon semiconductor substrate 1. The insulating film 8 located at the upper interior of the trench 4 is selectively removed by the isotropic etching as shown in FIG. 11. Ge is implanted into the boundary 12 between the inner peripheral wall of the trench 4 and the silicon semiconductor substrate 1 by the ion implanting technique. The insulating film 8 may be removed by the anisotropic etching.

Further, in the step of implanting Ge, it is implanted in an oblique direction from a vertical upper wall of the surface 1a of the silicon semiconductor substrate 1. More specifically, ion implantation is carried out so that Ge is implanted in the oblique direction from an upper portion of the trench 4. Furthermore, Ge is implanted to the boundary 12 formed in the section (see FIG. 2) extending in the direction of a long axis of an ellipse from the center of the trench 4, thereby being formed into the inclusion region 14. Regarding desired implanting conditions, an inclination of Ge to a direction perpendicular to the surface 1a of the silicon semiconductor substrate 1 ranges from 0 to 40°, an ion implantation acceleration energy ranges from 5 to 40 keV, and a density of Ge ranges from $1\times10^{12}$ to $1\times10^{16}$ [cm$^{-2}$]. An implanting range may take any value if it includes the boundary 12 between the third conductive layer 11 formed in the trench 4 and the cell transistor Tr.

Figure 12:
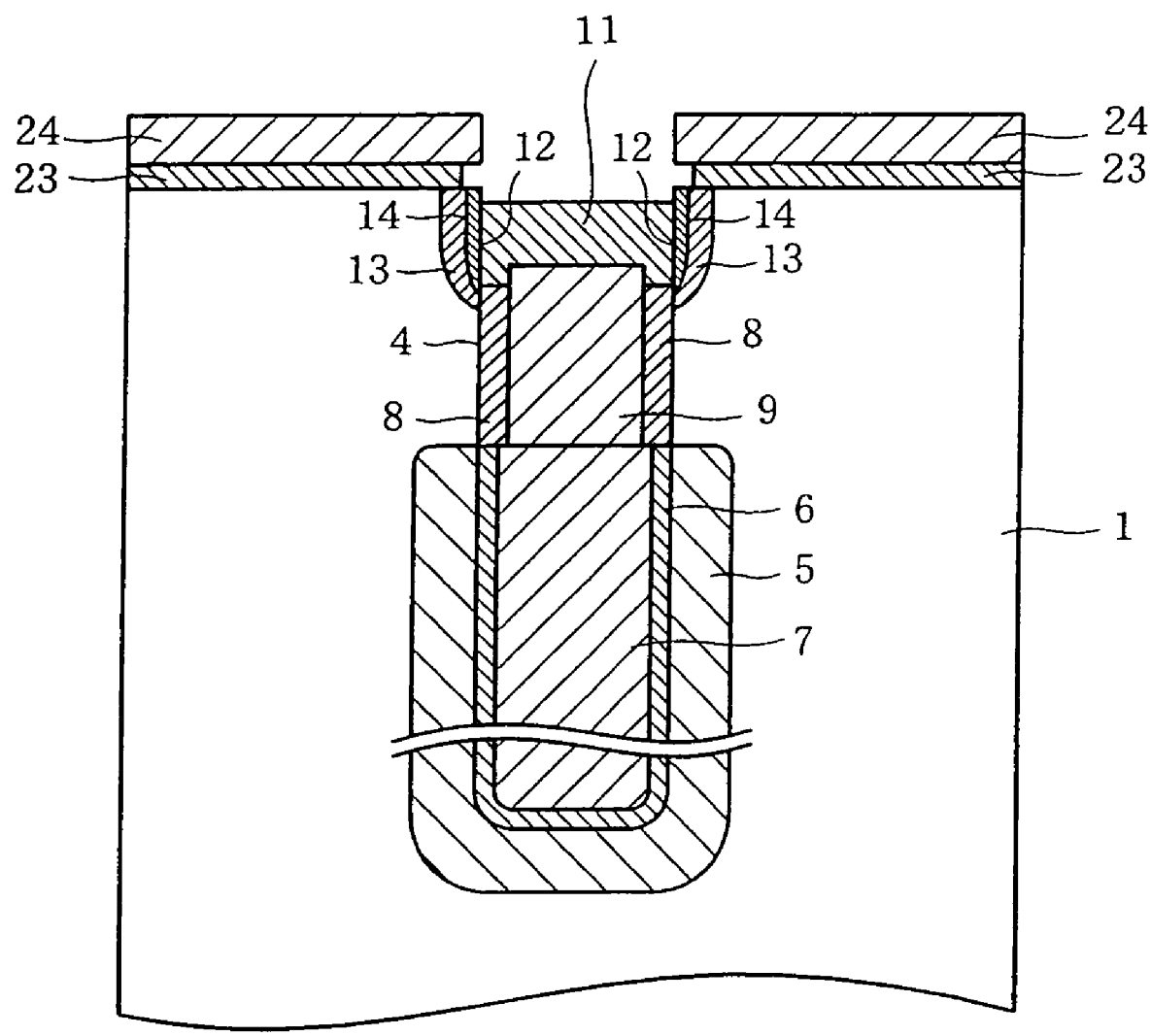
FIG. 12 is a longitudinal side section of the semiconductor device, showing a fabrication step thereof (step 10)

Furthermore, as shown in FIG. 12, the third conductive layer 11 made from the polycrystalline silicon doped with the donor impurity is formed on the upper portions of the second conductive layer 9 and the insulating film 8 and then etched back near the surface of the silicon semiconductor substrate 1. Thus, the third conductive layer 11 is buried in the trench 4. The first to third conductive layers 7, 9 and 11 are buried in the trench 4 in a self-aligning manner. Further, thermal treatment is carried out so that the donor impurity (phosphor or arsenic, for example) is diffused from the third conductive layer 11 to a part of the silicon semiconductor substrate 1 located around the upper portion of the trench 4. In this case, the impurity is diffused via the boundary 12 between the third conductive layer 11 and the silicon semiconductor substrate 1 from which the insulating film 8 has been removed so that the strap 13 is formed. The strap 13 is provided for suppressing electric resistance between the diffusion layer 15 of the cell transistor Tr and the trench capacitor C.

Subsequently, as shown in FIG. 1, the element isolation film 10 is formed on the side of the trench 4, and the cell transistor Tr is formed. In this case, the diffusion layer 15 of the cell transistor Tr is formed so as to conduct to the third conductive layer 11. A plurality of the memory cells 3 each of which is formed through the above-described forming steps are arranged, whereby the memory cell region is formed (see FIG. 2). Further, the interlayer insulating film 21 and the bit line 20 are formed. Thus, the DRAM 2 with the cell transistors Tr and trench capacitors C is fabricated.

According to the foregoing fabricating method of the first embodiment, Ge is implanted to the boundary 12 between the third conductive layer 11 and the silicon semiconductor substrate 1 by the ion implantation. Accordingly, even when the resistance suppressing strap 13 is formed by diffusing the impurity from the third conductive layer 11, diffusion of impurity can be suppressed. Furthermore, Ge is implanted under the condition of lower ion implantation acceleration energy as compared with other embodiments as will be described later. Consequently, Ge can easily be implanted to the boundary 12.

Figure 13:
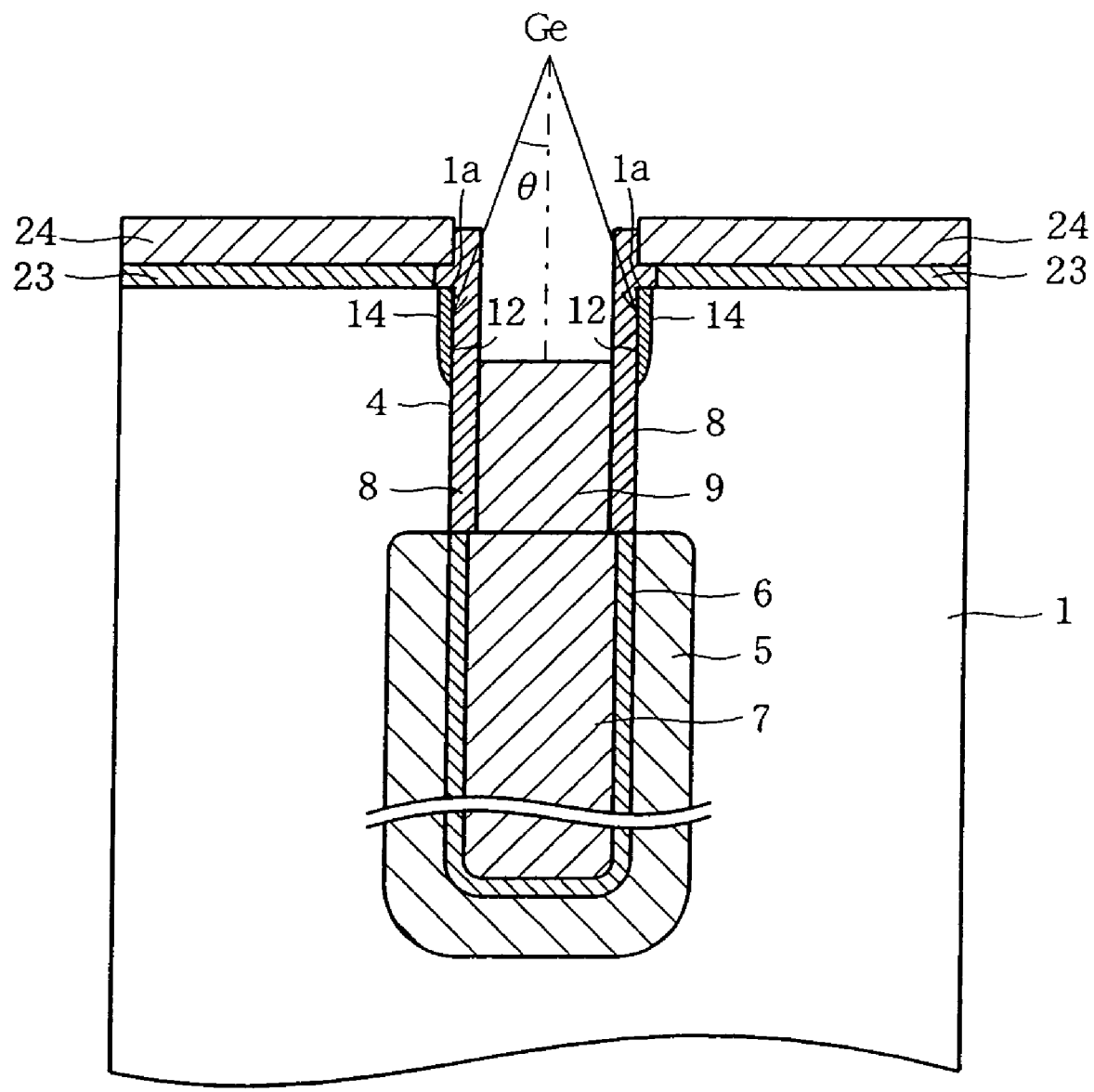
FIG. 13 is a longitudinal side section of the semiconductor device in accordance with a second embodiment of the invention, showing a fabrication step thereof.

FIG. 13 illustrates a second embodiment of the invention. The second embodiment differs from the first embodiment in the fabricating steps. Accordingly, the fabricating steps will hereinafter be described. Identical or similar parts are labeled by the same reference symbols in the second embodiment as those in the first embodiment.

In the first embodiment, the second conductive layer 9 is formed, and the insulating film 8 is etched thereby to be removed. Thereafter, Ge is implanted. However, after formation of the insulating film 8, the second conductive film 9 is formed and thereafter, Ge is implanted to the boundary 12 between the third conductive layer 11 and the silicon semiconductor substrate 1 by the ion implantation. More specifically, as shown in FIG. 13, the second conductive layer 9 is formed over the first conductive layer 7 so as to be located inside the insulating film 8 and then etched back to a predetermined level. Subsequently, Ge is implanted via the upper interior of the trench 4 over the second conductive layer 9 and insulating film 8 to the boundary 12. Regarding desired implanting conditions in this case, an inclination of Ge to a direction perpendicular to the surface 1a of the silicon semiconductor substrate 1 ranges from 0 to 40°, an ion implantation acceleration energy ranges from 5 to 60 keV, and a density of Ge ranges from $1\times10^{12}$ to $1\times10^{16}$ [cm$^{-2}$]. Subsequently, an upper part of the insulating film 8 located over the second conductive layer 9 is removed. The third conductive layer 11 is buried in the trench 4 and thereafter, impurity is diffused via the boundary 12 with implanted Ge to the silicon semiconductor substrate 1, whereby the strap 13 is formed.

The same effect can be achieved from the second embodiment as from the first embodiment.

Figure 14:
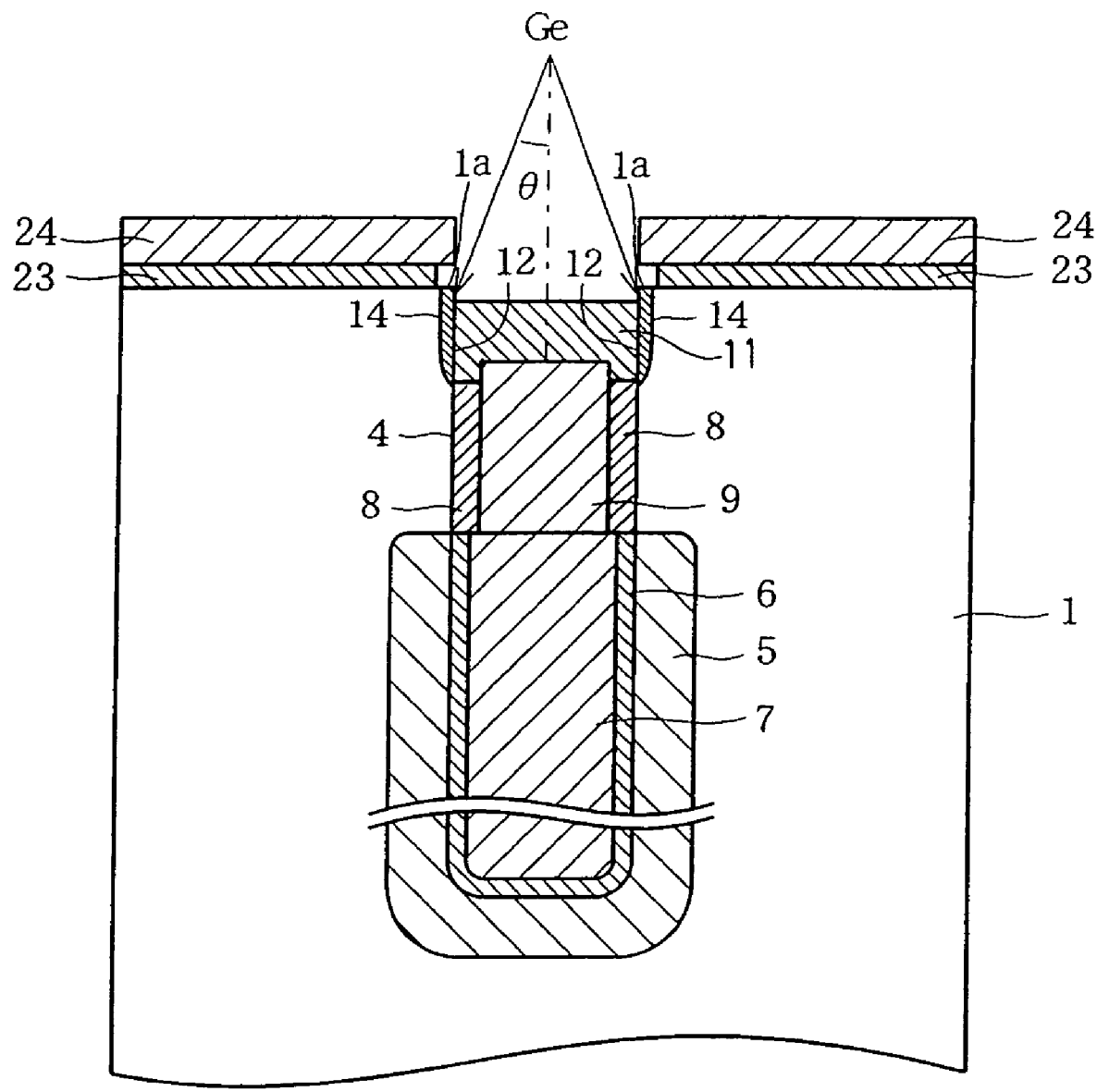
FIG. 14 is a longitudinal side section of the semiconductor device in accordance with a third embodiment of the invention, showing a fabrication step thereof.

FIG. 14 illustrates a third embodiment of the invention. The second embodiment differs from the first embodiment in the fabricating steps. Accordingly, the fabricating steps will hereinafter be described. Identical or similar parts are labeled by the same reference symbols in the second embodiment as those in the first embodiment.

In the third embodiment, Ge is implanted after the third conductive layer 11 has been buried. More specifically, as shown in FIG. 14, the third conductive layer 11 is buried in the trench 4 and then etched back to a predetermined level near the surface 1a of the silicon semiconductor substrate 1. Subsequently, Ge is implanted via the third conductive layer 11 to the boundary 12. Regarding desired implanting conditions in this case, an inclination of Ge to a direction perpendicular to the surface 1a of the silicon semiconductor substrate 1 ranges from 0 to 40°, an ion implantation acceleration energy ranges from 5 to 60 keV, and a density of Ge ranges from $1\times10^{12}$ to $1\times10^{16}$ [cm$^{-2}$]. After Ge has been implanted, impurity is diffused so that the strap 13 is formed.

The same effect can be achieved from the third embodiment as from the first embodiment.

The invention should not be limited to the foregoing embodiments but may be modified or expanded as follows. In the foregoing embodiments, the inclusion region 14 is provided between the third conductive layer 11 and the strap 13. However, the inclusion region 14 may be provided the first or second conductive layer 7 or 9 buried in the trench capacitor C and the strap 13, instead.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
   a semiconductor substrate;
   a trench capacitor formed in the semiconductor substrate;
   a cell transistor formed so as to conduct to the trench capacitor and having a gate electrode formed on the semiconductor substrate and a source/drain region formed in a surface of the semiconductor substrate;
   an impurity diffusion region formed in the semiconductor substrate so as to be electrically connected between the trench capacitor and the source/drain region; and
   a Ge inclusion region formed between the impurity diffusion region and the trench capacitor.

2. A semiconductor device according to claim 1, wherein the trench capacitor includes a trench, a first conductive layer buried in a lower portion of the trench, a second conductive layer buried in a middle portion of the trench and a third conductive layer buried in an upper portion of the trench.

3. A semiconductor device according to claim 2, wherein the third conductive layer is doped with an impurity and the impurity diffusion region is formed by diffusion of the impurity from the third conductive layer to the semiconductor substrate.

* * * * *